(12) United States Patent  (10) Patent No.: US 7,479,441 B2
Kirk et al. (45) Date of Patent: Jan. 20, 2009

(54) METHOD AND APPARATUS FOR FLAG-LESS WATER BONDING TOOL

(75) Inventors: Harry R. Kirk, Campbell, CA (US);
Francois J. Henley, Aptos, CA (US);
Philip James Ong, Milpitas, CA (US)

(73) Assignee: Silicon Genesis Corporation, San Jose, CA (US)

( * ) Notice: Subject to any disclaimer, the term of this patent is extended or adjusted under 35 U.S.C. 154(b) by 149 days.

(21) Appl. No.: 11/581,065

(22) Filed: Oct. 13, 2006

(65) Prior Publication Data

US 2007/0087531 A1    Apr. 19, 2007

Related U.S. Application Data

(60) Provisional application No. 60/727,142, filed on Oct. 14, 2005.

(51) Int. Cl.
*H01L 21/30* (2006.01)
(52) U.S. Cl. ........................... 438/455; 438/457
(58) Field of Classification Search ............... 438/455, 438/457, 118; 156/153, 349
See application file for complete search history.

(56) References Cited

U.S. PATENT DOCUMENTS 5,769,991 A * 6/1998 Miyazawa et al. .......... 156/153
5,843,832 A * 12/1998 Farmer et al. .............. 438/406
6,534,381 B2   3/2003 Cheung et al.
6,645,828 B1 * 11/2003 Farrens et al. ............. 438/455
2006/0286710 A1 * 12/2006 Sugita et al. .............. 438/106

OTHER PUBLICATIONS

B.N. Mukashev et al., *Hydrogen Implantation into Silicon: Infra-Red Absorption Spectra and Electrical Properties*, Institute of High Energy Physics, Academy of Sciences of the Kazakh SSR, Alma-Ata1; 91, 509 (1985).

* cited by examiner

*Primary Examiner*—Tuan H Nguyen
(74) *Attorney, Agent, or Firm*—Townsend and Townsend and Crew LLP (57) ABSTRACT

Embodiments in accordance with the present invention relate to methods and apparatuses for bonding together substrates in a manner that suppresses the formation of voids between them. In a specific embodiment, a backside of each substrate is adhered to a front area of flexible, porous chuck having a rear area in pneumatic communication with a vacuum. Application of the vacuum causes the chuck and the associated substrate to slightly bend. Owing to this bending, physical contact between local portions on the front side of the flexed substrates may be initiated, while maintaining other portions on front side of the substrates substantially free from contact with each other. A bond wave is formed and maintained at a determined velocity to form a continuous interface joining the front sides of the substrates, without formation of voids therebetween. In one embodiment, the chucks may comprise porous polyethylene sealed with polyimide except for a portion of the front configured to be in contact with the substrate, and a portion of the backside configured to be in communication with a vacuum source.

39 Claims, 7 Drawing Sheets

METHOD AND APPARATUS FOR FLAG-LESS WAFER BONDING TOOL

CROSS-REFERENCE TO RELATED APPLICATION

The instant nonprovisional patent application claims priority to U.S. Provisional Patent Application No. 60/727,142, filed Oct. 14, 2005 and incorporated by reference herein for all purposes.

BACKGROUND OF THE INVENTION

The present invention relates to the manufacture of substrates. More particularly, the invention provides a technique including a method and device for bonding a first substrate to a second substrate for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Integrated circuits are fabricated on chips of semiconductor material. These integrated circuits often contain thousands, or even millions, of transistors and other devices. In particular, it is desirable to put as many transistors as possible within a given area of semiconductor because more transistors typically provide greater functionality, and a smaller chip means more chips per wafer and lower costs.

Some integrated circuits are fabricated on a slice or wafer, of single-crystal (i.e., monocrystalline) silicon, commonly termed a "bulk" silicon wafer. Devices on such a "bulk" silicon wafer typically are isolated from each other. A variety of techniques have been proposed or used to isolate these devices from each other on the bulk silicon wafer, such as a local oxidation of silicon ("LOCOS") process, trench isolation, and others. These techniques, however, are not free from limitations. For example, conventional isolation techniques consume a considerable amount of valuable wafer surface area on the chip, and often generate a non-planar surface as an artifact of the isolation process. Either or both of these considerations generally limit the degree of integration achievable in a given chip. Additionally, trench isolation often requires a process of reactive ion etching, which is extremely time consuming and can be difficult to achieve accurately. Bulk silicon wafers, which are greater than 200 millimeters, are not free from defects and can reduce overall devices yields and the like.

An approach to achieving very-large scale integration ("VLSI") or ultra-large scale integration ("ULSI") uses epitaxial silicon wafers, which are commonly known as "epi-wafers." Epi-wafers often have a layer of high quality single crystalline silicon material defined overlying a face of a bulk substrate. The high quality silicon layer provides a good site for fabricating devices, often with higher yields, than conventional bulk silicon wafer materials. The high quality silicon material is often deposited by way of epitaxial silicon process reactors made by companies called Applied Materials, Inc. of Santa Clara, Calif. or ASM of Phoenix, Az.

Epitaxial wafers offer other advantages over bulk silicon technologies as well. For example, epitaxial wafers have almost perfect crystalline characteristics, which enhance device speed, functionality, and reliability. Additionally, the epitaxial wafers often provide higher device yields, than conventional bulk wafers. Many problems, however, than have already been solved regarding fabricating devices on bulk silicon wafers remain to be solved for fabricating devices on epitaxial silicon wafers. Epitaxial silicon wafers are made by way of epitaxial reactors, which are often expensive to purchase and difficult to maintain. The process of forming epitaxial silicon is also slow and time consuming. Accordingly, resulting epitaxial silicon wafers can often be expensive and cannot be used for the manufacture of many commercial or commodity devices such as dynamic random access memory devices (i.e., DRAMs), for example.

Another approach to achieving large scale integration often uses bonding substrates made of silicon bearing materials. Such bonding wafers are often made using layer transfer techniques and plasma activated bonding processes. An example of such a plasma activated process is described in U.S. Pat. No. 6,645,828, in the names of Farrens et al., which issued Nov. 11, 2003, and is commonly assigned to Silicon Genesis Corporation of San Jose, Calif. The Farrens et al. application relates generally to in-situ plasma activated bonding techniques. These techniques have become important for the manufacture of bonding semiconductor substrates. Although Farrens et al. has been effective, there may still be a need for improved bonding techniques.

From the above, it is seen that an improved technique for manufacturing a multi-layered wafer is highly desirable.

BRIEF SUMMARY OF THE INVENTION

Embodiments in accordance with the present invention relate to methods and apparatuses for bonding together substrates in a manner that suppresses the formation of voids between them. In a specific embodiment, a backside of each substrate is adhered to a front area of flexible, porous chuck having a rear area in pneumatic communication with a vacuum. Application of the vacuum causes the chuck and the associated substrate to slightly bend. Owing to this bending, physical contact between local portions on the front side of the flexed substrates may be initiated, while maintaining other portions on front side of the substrates substantially free from contact with each other. A bond wave is formed and maintained at a determined velocity to form a continuous interface joining the front sides of the substrates, without formation of voids therebetween. In one embodiment, the chucks may comprise porous polyethylene sealed with polyimide except for a portion of the front configured to be in contact with the substrate, and a portion of the backside configured to be in communication with a vacuum source.

According to embodiments of the present invention, techniques for the manufacture of substrates are provided. More particularly, embodiments in accordance with the present invention provide techniques including a method and device for bonding a first substrate to a second substrate for the manufacture of semiconductor integrated circuits, for example. But it will be recognized that embodiments in accordance with the present invention have a wider range of applicability; and can also be applied to other substrates for forming multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

In a specific embodiment, the present invention provides a method for forming multi-layered materials. The embodiment of the method includes providing a first substrate having a first backside surface and a first surface region. The first surface region is characterized by a first end and a second end. The method includes providing a second substrate having a second backside surface and a second surface region, which is characterized by a third end and a fourth end. In a specific embodiment, the substrates can be similar or dissimilar. The substrates can also be silicon wafers, glass substrates (e.g., glass, flat panel display glass (e.g., "large area" glass)), quartz, patterned substrates, homogeneous substrates, graded substrates, strained layers on substrates, composite substrates, and others, depending upon the embodiment. The method includes initiating a physical contact of a first predetermined portion of the first end of the first surface region with a second predetermined portion of the third end of the second surface region, while maintaining other portions of the first surface region and the second surface region substantially free from joining the other portions of the first surface region to the second surface region. The method also causes a bond wave to form by an interface region within a vicinity of the first predetermined portion and the second predetermined portion. The method also moves, using a controlled process, the bond wave from the first end of the first surface and the third end of the second surface to the second end of the first surface and the fourth end of the second surface while maintaining a determined velocity of the bond wave to form a continuous interface to join the first surface of the first substrate with the second surface of the second surface.

An embodiment of a method in accordance with the present invention for forming multi-layered materials, comprises, providing a first substrate having a first backside surface and a first surface region, the first surface region being characterized by a first end and a second end. A second substrate is provided having a second backside surface and a second surface region, the second surface region being characterized by a third end and a fourth end. A physical contact of a first predetermined portion of the first end of the first surface region is initiated with a second predetermined portion of the third end of the second surface region, while maintaining other portions of the first surface region and the second surface region substantially free from joining the other portions of the first surface region to the second surface region. A bond wave is caused to form by an interface region within a vicinity of the first predetermined portion and the second predetermined portion. Using a controlled process, the bond wave is moved from the first end of the first surface and the third end of the second surface to the second end of the first surface and the fourth end of the second surface while maintaining a determined velocity of the bond wave to form a continuous interface to join the first surface of the first substrate with the second surface of the second surface.

An embodiment of an apparatus in accordance with the present invention comprises a first porous and flexible chuck in pneumatic communication with a vacuum, and a second porous and flexible chuck in pneumatic communication with the vacuum. A substrate handing apparatus is configured to position a backside of a first wafer in contact with the first chuck, and to position a backside of a second wafer in contact with the second chuck. An energy source is configured to pinch together first ends of the first and second wafers and thereby initiate a bonding wave.

Various additional objects, features and advantages of the present invention can be more fully appreciated with reference to the detailed description and accompanying drawings that follow.

DETAILED DESCRIPTION OF THE INVENTION

Embodiments in accordance with the present invention relate to methods and apparatuses for bonding together substrates in a manner that suppresses the formation of voids between them. In a specific embodiment, a backside of each substrate is adhered to a front area of flexible, porous chuck having a rear area in pneumatic communication with a vacuum. Application of the vacuum causes the chuck and the associated substrate to slightly bend. Owing to this bending, physical contact between local portions on the front side of the flexed substrates may be initiated, while maintaining other portions on front side of the substrates substantially free from contact with each other. A bond wave is formed and maintained at a determined velocity to form a continuous interface joining the front sides of the substrates, without formation of voids therebetween. In one embodiment, the chucks may comprise porous polyethylene sealed with polyimide except for a portion of the front configured to be in contact with the substrate, and a portion of the backside configured to be in communication with a vacuum source.

According to the present invention, techniques for the manufacture of substrates are provided. More particularly, the invention provides a technique including a method and device for bonding a first substrate to a second substrate for the manufacture of semiconductor integrated circuits, for example. But it will be recognized that the invention has a wider range of applicability; it can also be applied to other substrates for multi-layered integrated circuit devices, three-dimensional packaging of integrated semiconductor devices, photonic devices, piezoelectronic devices, microelectromechanical systems ("MEMS"), sensors, actuators, solar cells, flat panel displays (e.g., LCD, AMLCD), biological and biomedical devices, and the like.

Embodiments in accordance with the present invention may be utilized to bond together wafers utilizing a compliant material. In accordance with one embodiment of the present invention, the compliant material may comprise a macroscopic deformable adhesive material, such as a glue. In accordance with other embodiments of the present invention, the compliant material may comprise a substrate surface region exhibiting particular characteristics, for example as described in U.S. Pat. No. 6,534,381, commonly assigned and incorporated by reference herein for all purposes. Specifically, in U.S. Pat. No. 6,534,381, implantation of ions into a substrate surface results produces an amorphous characteristic in that surface. The amorphous characteristic of the substrate surface provides a compliant layer for embedding one or more surface nonuniformities (e.g. particles, hillocks) into the compliant layer to bring a greater portion of the substrate surfaces together.

Formation of a compliant substrate having an amorphous characteristic resulting from implantation, is only one technique described by U.S. Pat. No. 6,534,381. Other types of compliant materials can be used. In certain embodiments, a compliant layer may be a doped or undoped spin-on glass (SOG), formed on a substrate by application of organic or inorganic spin-on techniques In accordance with other embodiments, a compliant layer can be made by way of deposition techniques such as chemical vapor deposition, plasma enhanced chemical vapor deposition, and others. Some suitable deposition materials can include, among others, amorphous silicon, amorphous silicon germanium and amorphous germanium. The amorphous silicon layer can be deposited using a deposition furnace such as one made by Tokyo Electron Limited. The deposition furnace forms amorphous silicon from a silicon bearing compound (e.g., silane or dichlorosilane), which is deposited at a low temperature, e.g., 550 degrees Celsius and less. Other types of techniques such as etching and implantation of other types of particles such as germanium or hydrogen, can also be used. Also, plasma enhanced chemical vapor deposition can be used to form the compliant layer. In a specific embodiment, a cleaning process may be performed on a surface of the implanted substrate. The cleaning process substantially removes particulates and/or chemicals from the surface. The particulates include among others particles greater than about 0.1 μm in dimension. They also include particles greater than about 5 μm in dimension.

Direct wafer bonding is a method of joining two semiconductor wafers such as two silicon wafers without employing a separate macroscopic deformable adhesive material, such as a glue or paste layer. The wafers may be coated with a solid film conformal to the surfaces of the wafers. In the case of silicon, the optional solid films may include materials such as silicon dioxide or silicon nitride. The coatings may well affect the bonding of the wafers. However, in direct bonding such films are macroscopically non-deformable and do not flow to fill gaps between the wafers during the bonding process. Therefore, such films do not function as adhesives. The bonding of such wafers is considered to be direct, meaning that nearly identically flat surfaces are joined by elastically deforming wafers so that their free surfaces become replaced by a single interface.

It is a general principle of solid material that surfaces are at an elevated free energy that significantly exceeds the internal free energy of atoms in the bulk of the solid. The free energy difference between surface atoms and interior or bulk atoms may be referred to as the surface energy of a solid material, having SI units Joules per square meter.

If two materials are direct bonded it means that their surfaces combine exothermically because atoms forming the interface have a lower free energy than they would have as free surfaces. The energy difference between free surfaces and surfaces bonded at an interface drives the wafer bonding process. For purposes of this disclosure, it is useful to refer to this energy as the Bond Driving Energy. In thermodynamics, if system events occur spontaneously then by definition the free energy of the system is reduced, but in the vernacular higher bond energy means that surfaces are more inclined to bond and less inclined to disbond spontaneously or under the action of an externally applied force. Therefore we write that the bond driving energy is given by:

$$\text{Bond Driving Energy} = \text{Bonded Interface Energy} - \text{Free Surface Energy} \quad (\text{Eq. 1})$$

with the understanding that all the signs are reversed for the sake of clarity.

Wafers require extreme flatness and smoothness in order to direct bond. They must also be thin enough. Typically, wafers should have less than 5 Angstroms of root mean square (rms) surface roughness over every 10-micron by 10 micron area of surfaces to be bonded. Note that rms roughness is mathematically equivalent to the standard deviation of the surface height. The flatness as measured by wafer warp is typically less than 100 microns, meaning that a best fit plane of the surface would deviate from the actual surface by less than 100 microns over the area of the entire wafer (for a typical 200 mm diameter wafer or others, e.g., bulk silicon wafer). The wafers should be less than two to five mm thick, although less than a single mm of wafer thickness is preferred.

Deviations between the nearly perfectly flat wafers can be overcome by elastically deforming the wafers so that they share a common bonded interface. The elastic deformation of the wafers requires energy. For purposes of this disclosure the energy needed to elastically deform the wafers to achieve bonding is referred to as the Elastic Resistance Energy. We define the Bond Energy (BE) as the difference between the Bond Driving Force Energy (BDE) and the Elastic Resistance Energy (ERE). In equation form we write:

$$BE = BDE - ERE \quad (\text{Eq. 2})$$

Again, the SI units are Joules per square Meter.

Figure 1:
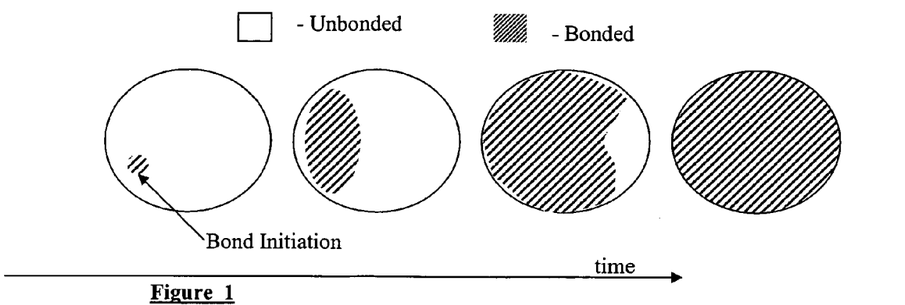
FIG. 1 is a simplified schematic diagram illustrating progress of a bond wave looking down at a wafer pair.

Generally when two wafers are bonded, the bond begins in an isolated, small area called the bond initiation area and progresses as a wave until the elastic resistance energy exceeds the bond driving energy everywhere on the un-bonded portion of the wafers. FIG. 1 is a simplified schematic diagram illustrating progress of a bond wave looking down at a wafer pair.

There is a distinct boundary between bonded and un-bonded regions. If the bond driving energy is greater than the elastic resistance energy, the bond wave moves forward and the bond progresses. If the elastic resistance energy is greater than the bond driving energy the bond wave stops. The fact that the bond progresses as a wave indicates that the elastic resistance energy barrier is smallest for bonding an incremental area of wafer free surfaces immediately adjacent to the existing bonded region. Bonding of free surfaces in regions remote from the bond wave front is evidently not favored.

Gravity acting alone is not particularly effective at initiating the bond. If one wafer is sitting on top of another, they do not generally bond. Instead, the bond wave is typically initiated at a specific location. Initiation is accomplished by supplying an external force typically near one end of the wafer pair. In manual bonding, this is accomplished by "pinching" the wafers together at on end. In a mechanical bonding tool, a bond wave initiation occurs when a pin strikes down on the wafer pair with a controlled force impulse.

Bonding voids are regions of the wafer pair that remain unbonded after the bond wave has stopped propagating. Typically, voids will be surrounded by bonded material and contain captured ambient gas. Generally, a bonding void is caused by deleterious in-homogeneities in the bond driving energy or the elastic resistance energy. Such in-homogeneities in the bond driving force may be caused by cleaning residues, variation in film coating chemistry, or surface preparation techniques such as plasma activation.

Figure 2:
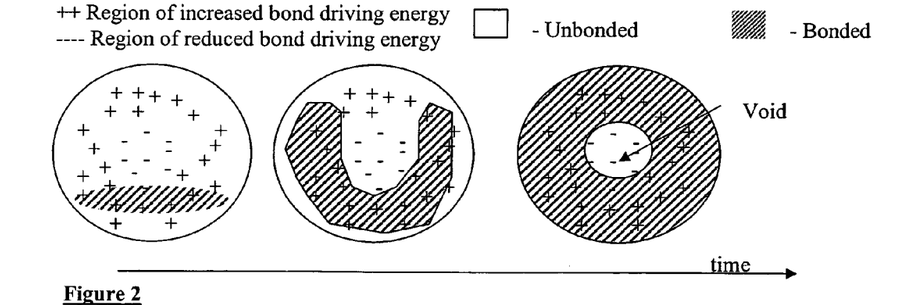
FIG. 2 is a simplified diagram illustrating a void formed by an inhomogeneity in the bond driving energy.

The effect of such an in-homogeneity is shown in FIG. 2. The bond wave will tend to "race" around a region of low bond driving energy in favor of a region of high bond driving energy as shown in FIG. 2. A void formed in this manner of FIG. 2 may be called a capture void if the bond driving energy is not at or below zero and the wafer would have bonded if the void did not capture ambient gas.

Figure 3:
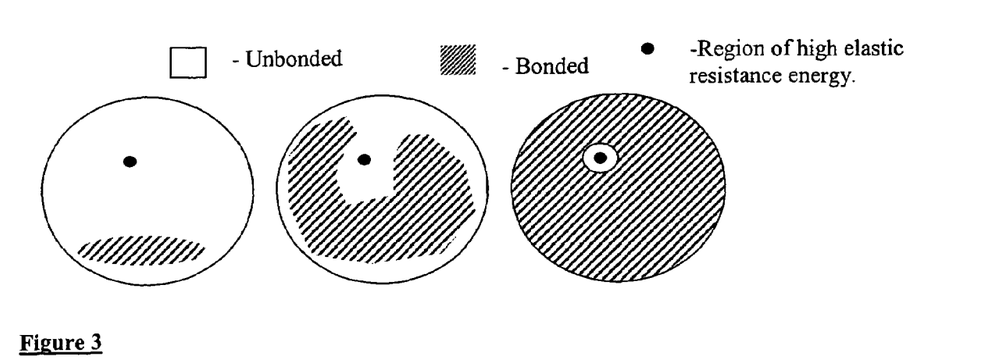
FIG. 3 is a simplified diagram illustrating a void formed by an inhomogeneity in the elastic resistance energy.

In-homogeneities in the elastic resistance energy can also cause voids. This type of in-homogeneity may be caused by particulates, localized roughness, or variations in site flatness. FIG. 3 illustrates this type of void formation. Such voids may be capture voids if the interior region of enhanced elastic resistance energy does not exceed the bond driving force. Particulates can also cause this type of void because the wafers cannot elastically bend around the particles.

Another source of void formation might be accidental bond wave initiation(s) independent from the bond pin initiation so that multiple propagating bond waves intersect in such a way that a void is formed.

One strategy for controlling the bond wave relies on the timing of the initiation and controlling the quality of the wafers to be bonded. The typical bonding sequence is as follows. The first wafer is placed face up upon a chuck. Small jigs called "flags" are inserted above the first wafer near one edge so that when the second wafer is positioned face down atop the first wafer, the flags prevent the onset of bonding. The flags are removed in a certain programmed order and the wafers are allowed to fall together under the influence of gravity. The wafers are pushed together at the site of the intended bond wave initiation by a localized impulse force caused by a programmed strike or nudge with another jig call a bonding pin. In order to optimally propagate the bond wave for minimum void formation, the bonder is programmed to precisely control the sequencing of the bond pin and flag jigs. The force supplied by the nudge action of the bond pin is also controlled very precisely.

Nonetheless, there is an inherent weakness in the strategy of bond wave control by the bond pin and flag method. In such instances, the bond wave is initiated by the bonding pin, but thereafter, the bond wave propagates spontaneously. Only the ambient gas pressure, the bond driving energy, and elastic resistance energy, are available to affect the progress of the bond wave. Therefore, modes of void formation as described above may be operative. In order to raise the process yield, wafer quality and initiation sequencing of the flag, bonding pin and ambient gas composition and pressure can be controlled. Of these, it is not advantageous to provide a special bonding chamber with its own ambient gas and pressure, or to have the bonder dictate the fabrication ambient.

Figure 4:
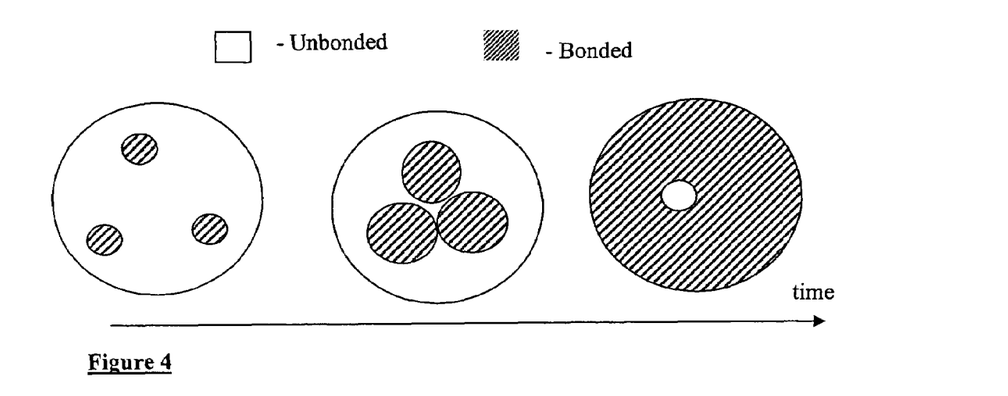
FIG. 4 is a simplified diagram illustrating void formation caused by multiple bond wave initiations.

The purpose of the bonder disclosed herein is to describe embodiments of a mechanical bonding tool in accordance with the present invention that operates in a clean room or fabrication facility at ambient pressure, and that is not subject to capture voids due to any of the three mechanisms illustrated above in FIGS. 2-4. The bonding strategy in accordance with embodiments of the present invention does not utilize flags or bonding pins. A mechanical bonding tool cannot alter the bond driving energy of a wafer pair. However, the bond elastic resistance energy can be tightly controlled by slightly bending a wafer pair in accordance with embodiments of the present invention until bonding is ready to commence.

Embodiments of the bonder disclosed herein comprise two flexible chucks made of porous polyethylene or similar polymer material manufactured by the GenPore Corporation, a Division of General Polymeric Corporation of Reading Pa. The pores are about 10-100 microns radius, and permeate the chuck material so that a gas can readily flow through the material. The surfaces of the chuck are sealed with a polyimide film (Kapton® by DuPont) with a silicone adhesive, except for an opening that is the size of the wafers to be bonded. Flexible vacuum lines are also connected to the back of the chuck through openings in the polyimide film. A mechanism is provided attached to the back of the chuck, that enables controlled cylindrical bending of the chuck by turning a screw.

When a wafer is placed on the chuck with the vacuum power on, the wafer adheres firmly to the shape of the chuck. Initially, the wafer is placed on the chuck while the chuck is flat. In accordance with embodiments of the present invention, once the wafer is attached to the chuck with the vacuum power on, the bending mechanism on the backside of the chuck induces a slight cylindrical bend to the chuck and the wafer sitting on it. Depending upon the embodiment, bonding can be performed under a limited or high vacuum where a flexible electrostatic chuck can be substituted for the flexible vacuum chuck. Of course, there can be other variations, modifications, and alternatives.

Figure 5:
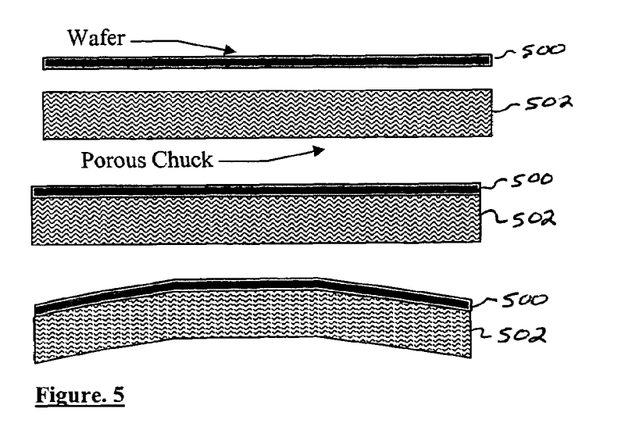
FIG. 5 is a simplified illustration of a wafer fixed on a vacuum chuck and bent in accordance with an embodiment of the present invention.

FIG. 5 illustrates a wafer 500 being placed on a porous flexible chuck 502. The chuck 502 is then flexed. Note that the bending shown in FIG. 5 is greatly exaggerated. Recall that if a wafer is warped over 100 microns, it does not meet specifications for bonding. The purpose of the bending is to make bonding impossible while the wafers are being positioned.

Figure 6:
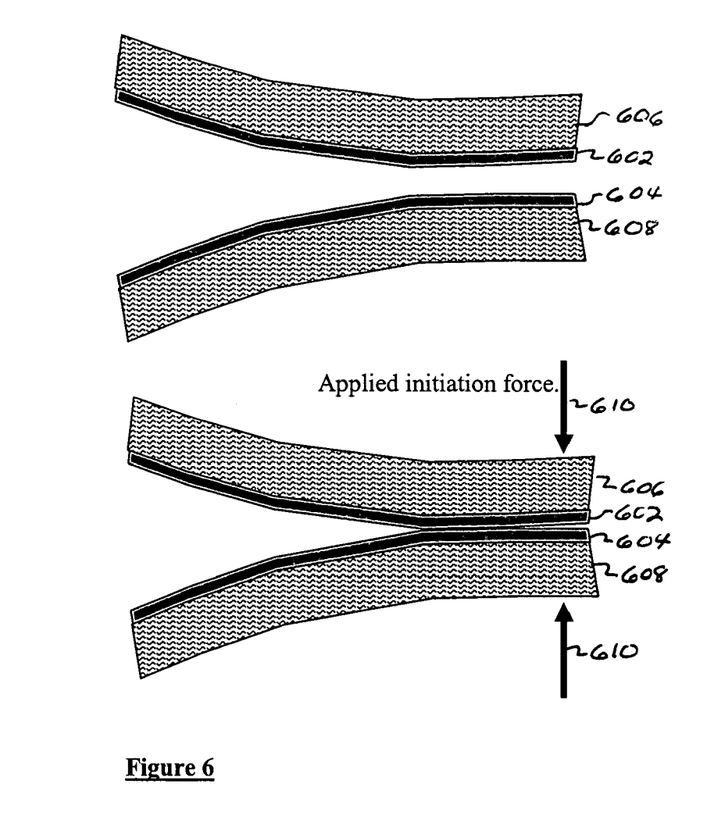
FIG. 6 is a simplified illustration of two wafers bent together on flexible bonding chucks according to an embodiment of the present invention.

FIG. 6 illustrates two wafers 602 and 604 placed together in the bent mode while mounted on the chucks 606 and 608, respectively. Note that the wafer pair 602/604 cannot bond due to the bend. The bond driving force is less than the elastic resistance energy so the bond does not propagate while the vacuum power to the chuck is activated. As shown in FIG. 6, the wafers are placed together so that the contact point is at one end of the wafers with the intention that the bond wave will traverse the wafer once the vacuum power is deactivated. A pinching (initiation) force 610 is applied to the contact point by the bonder. This force initiates the bond wave without the use of a bonding pin.

Figure 7:
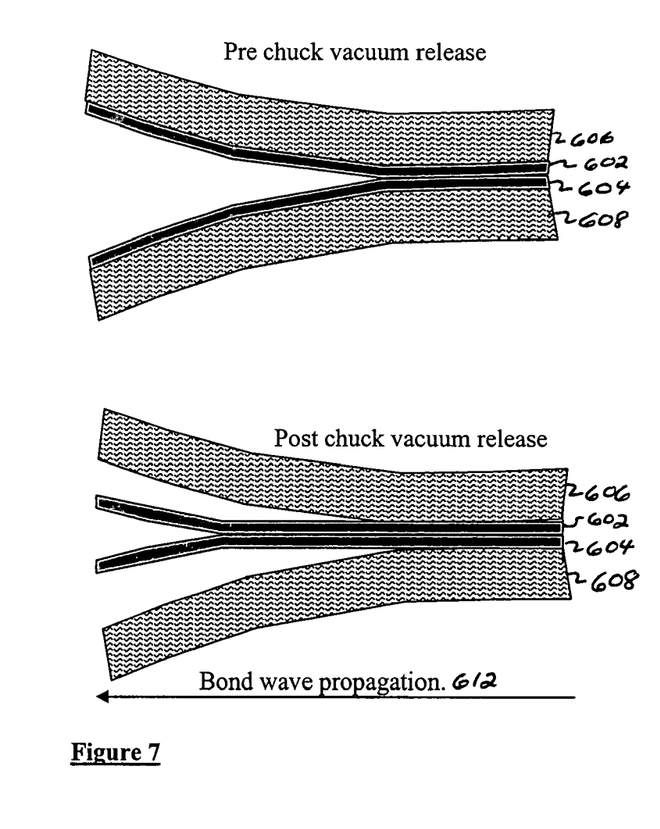
FIG. 7 is a simplified illustration of a propagating bond wave after vacuum release according to an embodiment of the present invention.

FIG. 7 illustrates the propagation of the bond wave after the vacuum power is released and the wafers 602/604 are allowed to come together. Recall that the wafer bending is greatly exaggerated in the illustration. Since the actual total wafer deflection is on the order of a millimeter, the wafers will come together very gently. Recall that a purpose of the bending is to supply an elastic energy resistance to the bond wave propagation 612 until the wafers are precisely positioned for bonding.

Embodiments of the method illustrated in FIGS. 5-7 eliminate the need for flags and bonding pins. However, once the vacuum is released and the bond wave initiation force is removed, the bond wave advances spontaneously as it does for conventional bonding. As such, the wafer bonding is still somewhat subject to the void formation modes illustrated in FIGS. 2-4.

Figure 8:
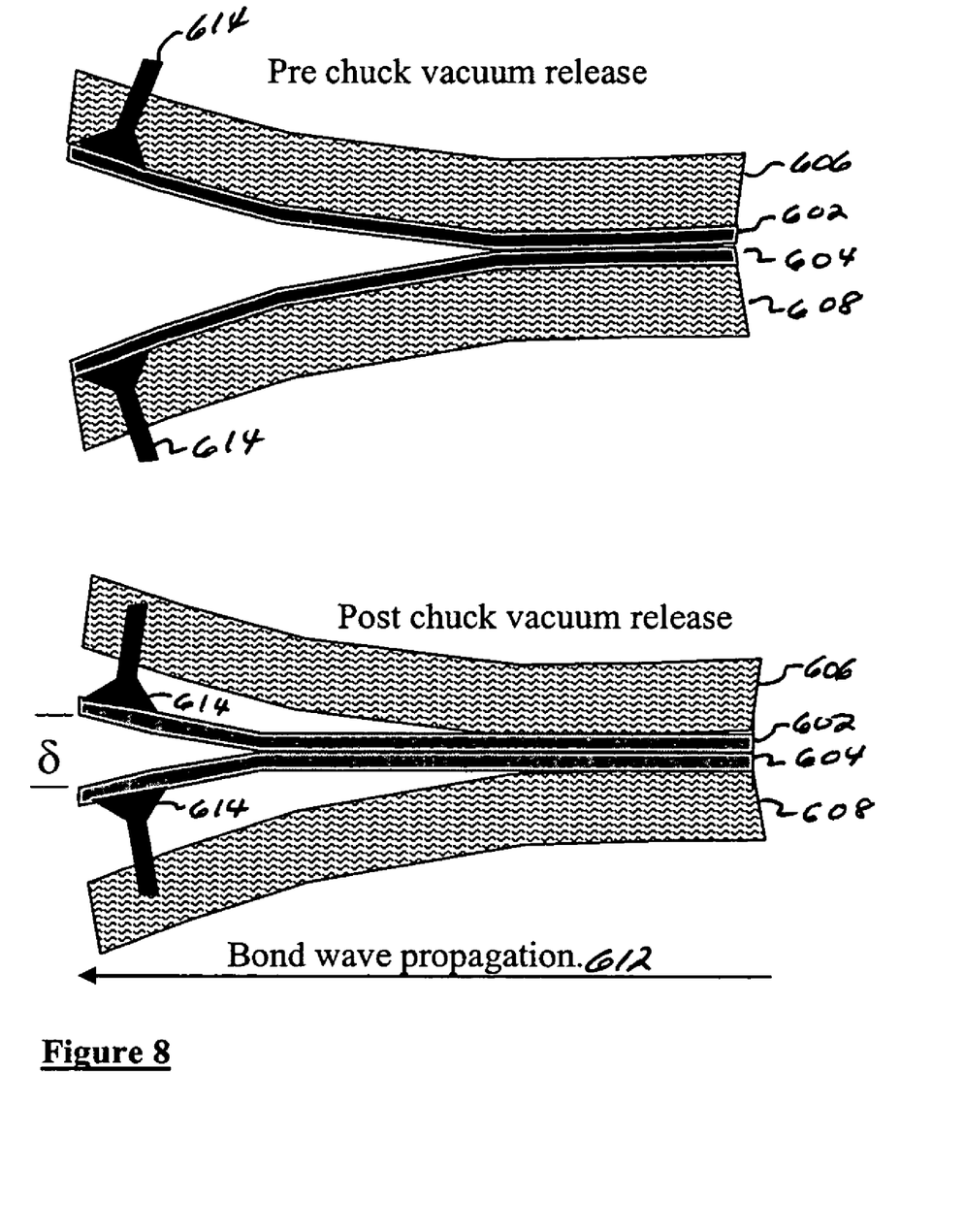
FIG. 8 is a simplified illustration of a propagating bond wave after chuck vacuum release, using backside suction cups to control the propagation of the bond wave according to an embodiment of the present invention.

In order to force the bond wave to advance in a more controlled manner, it can be slowed down to eliminate race conditions that result in capture voids. To accomplish this desired bond wave slowing, in accordance with certain embodiments, vacuum suction cups may be added to the most deflected side of the chuck as shown in FIG. 8. When the vacuum to the chuck is deactivated, the cups 614 maintain a separation between the wafers. The bond wave cannot advance any further than a distance L from the suction cup side of the wafers. The distance L is determined by the separation between the wafers at the suction cups denoted herein as δ.

Once bonding has commenced, the suction cups move slowly together allowing the bond wave to advance slowly as well. This effectively eliminates the capture void problem. The cups are slowly moved together decreasing the distance δ, allowing the bond wave to move forward. When the wafers are only separated by a few microns, the vacuum power to the suction cups is released and bonding is completed. Depending upon the embodiment, the bond wave can be formed using a gradual release of the chuck deflection, which causes the substrates to come together in a controlled manner.

While the embodiment of FIG. 8 has been shown and described in connection with the use of suction "cups", these structures are not required by the present invention. Apparatuses and methods utilizing suction from structures other than "cups", for example openings in fluid communication with a vacuum source, may alternatively be employed. In addition, suction itself is not required to grip the substrates, and other approaches, not limited to electrostatic-based or mechanical-based substrate gripping, could alternatively be employed.

In accordance with certain embodiments of the present invention, the bond-bending flexible vacuum chucks operate under ambient atmospheric conditions. Therefore, they are well suited for operation with an edge handling system.

Figure 9:
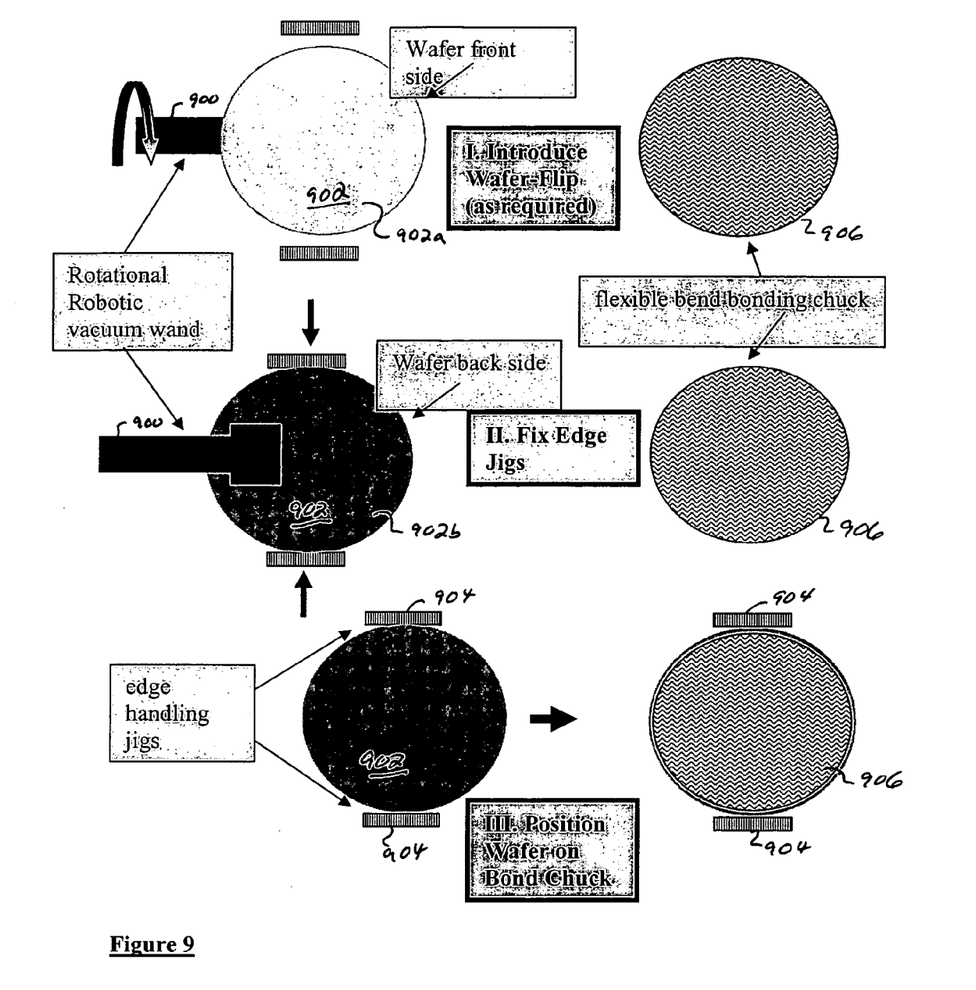
FIG. 9 is a simplified illustration of a plan view of edge handling jigs in operation for positioning wafers on flexible bend bonding chucks in flipped up or flipped down configurations, according to embodiments of the present invention.

Edge handlers could work in conjunction with the chucks as illustrated in the embodiment of FIG. 9. A rotational robotic vacuum wand 900 first carries the wafer face-902*a* up or facedown as required, to the edge-handling jig 904. The edge-handling jig 904 removes the wafer 902 from the vacuum wand 900 and then positions it on the flexible vacuum chuck 906.

Figure 10:
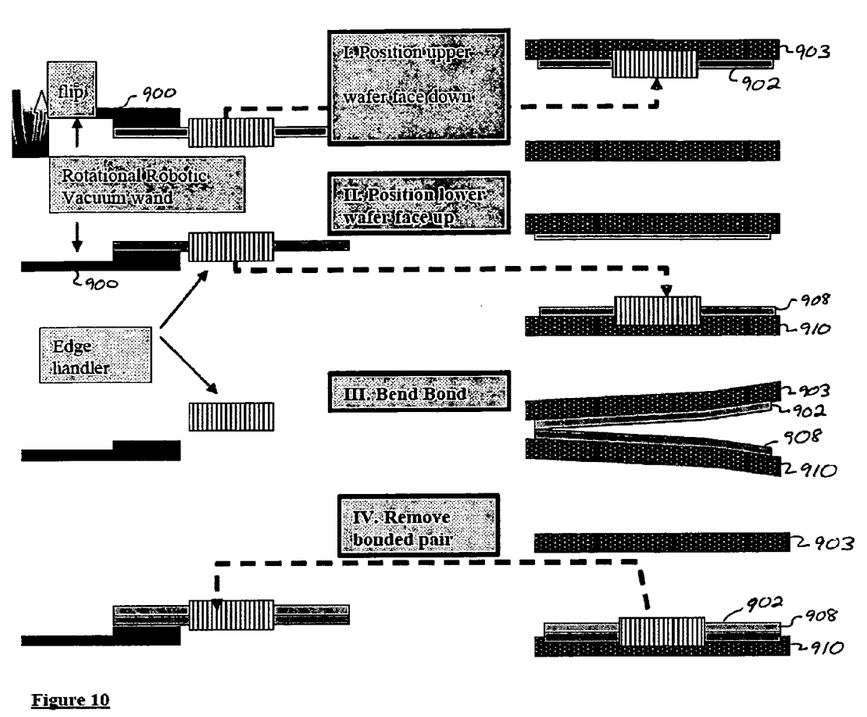
FIG. 10 is a simplified diagram illustrating a cross-sectional view of a bond sequence with Edge Handling jigs for positioning wafers on flexible bend bonding chucks in flipped up or flipped down configurations, according to an embodiment of the present invention.

The bonding sequence utilizing these elements is illustrated in simplified cross-section in FIG. 10. First, wafer one 902 is positioned facedown on the upper chuck 903. Wafer two 908 is positioned face up on the lower chuck 910. The wafers are then slightly flexed as described above by the two chucks 903 and 910. The chucks are then brought together and the wafers bonded. Afterwards, the bonded pair is removed from the flexible chucks and replaced on the vacuum wand, using the same edge handling system. The process is then repeated as necessary.

As illustrated in FIG. 10, embodiments in accordance with the present invention utilizes physical flexibility of a substrate to allow bonding to occur. Substrates exhibiting sufficient flexibility to be bonded together according to embodiments of the present invention are not limited to any specific type of substrate having any particular composition, thickness, or size. Examples of single crystal silicon substrates which may be bonded utilizing embodiments in accordance with the present invention include, but are not limited to, substrates having a diameter of 300 mm and a thickness of 775±25 μm, substrates having a diameter of 200 mm and a thickness of 725±15 μm, and substrates having a diameter of 150 mm and thicknesses of 625±5 μm or 675±25 μm. Examples of germanium substrates which may be bonded utilizing embodiments of the present invention include, but are not limited to, germanium substrates having a diameter of 150 mm 675±20 μm. Examples of glass or quartz substrates which may be bonded utilizing the present invention include, but are not limited to, substrates having a diameter of 200 mm and a thickness of 700±20 μm, and substrates having a diameter of 150 mm and thicknesses of 625±20 μm.

For wafers <200 microns thick (sometimes referred to as Ultra-thin (UT) wafers), wafer handling and bonding can be difficult. The wafers are delicate and easily broken. In addition, because the wafers are more flexible, they are more susceptible to void formation. According to U.S. Pat. No. 5,843,832, ordinary vacuum chucks cause unacceptable deformation of UT wafers during bonding.

However porous chucking causes very limited wafer deformation and is essentially non-deforming provided that the pore diameter is small relative to the UT wafer thickness. As a rule of thumb, the thickness should be an order of magnitude greater than the pore size. For example, if the UT wafer is 100 microns thick then the pore size should be less than 10 microns. An alternative would be to use an electrostatic chuck flexible chuck.

In the case of the bonding of a UT wafer, the thickness can be effectively increased by attaching the wafer to a backing plate (vacuum or electrostatic chuck for example) to form a composite assembly that has an effective flexure mechanical equivalent to a wafer having a thickness greater than, say, 300 microns, for example. The composite assembly is then bonded to another substrate using the bonding techniques disclosed herein with handling procedures appropriate for the particular UT wafer under consideration.

Figure 11:
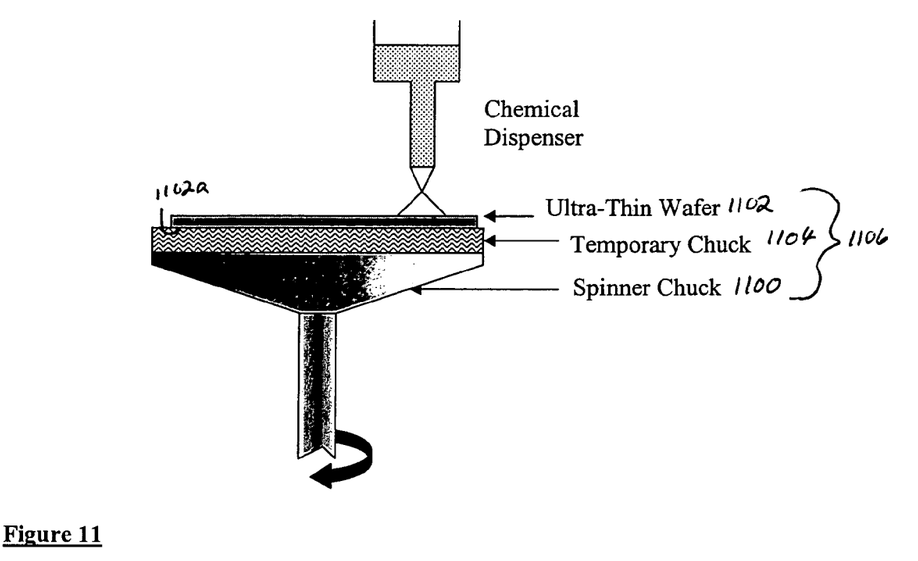
FIG. 11 is a simplified diagram of an Ultra thin (UT) wafer on temporary backing chuck during pre-bond surface preparation according to an embodiment of the present invention.

One issue with bonding UT wafers in addition to chucking and handling is pre-bond cleaning or surface preparation. According to U.S. Pat. No. 5,843,832, wafers should be capable of withstanding cleaning while free standing in cassettes separated by spacers. However, by first attaching the wafer to an appropriate porous or electrostatic chuck in accordance with embodiments of the present invention, the UT wafer can be cleaned or surface prepped for bonding. This technique of providing a backing chuck has been used for layer transfer processing at the cleaving step. In accordance with embodiments of the present invention, the wafer is attached prior to cleaning for support. This technique is especially suited for surface prep in a spinner 1100, as shown in FIG. 11. The UT wafer backside 1102 is first attached to the porous or ES chuck 1104. The composite assembly 1106 is spun while pre-bond cleans and rinses are performed on the wafer front-side.

Many benefits may be achieved by way of embodiments in accordance with the present invention over conventional techniques. For example, certain embodiments in accordance with the present invention provide an easy to use process that relies upon conventional technology. In some embodiments, the method provides higher device yields. Additionally, embodiments of methods in accordance with the present invention may provide a process that is compatible with conventional process technology without substantial modifications to conventional equipment and processes. Certain embodiments of the invention preferably provides for an improved process integration for advanced integrated circuit devices. Other features, benefits, and/or advantages may also be achieved as follows:

A. In a specific embodiment, the present invention uses surfaces that are characterized by a high surface energy (e.g., 0.2-2 joules/centimeters$^2$) before bonding occurs. Depending upon the embodiment, plasma activation can be used to activate the surfaces of the substrates before bonding according to a specific embodiment. Other embodiments can also include anodic bonding and/or other techniques.

B. In a specific embodiment, the present invention provides a method that uses lower bond pressures (e.g., 50-100 milliliter) and higher bond energies for silicon wafers. Lower bond pressures and higher bond energies can be used with a lower ambient gas pressure, which causes a high bond wave speed (e.g., 10-0.1 centimeters/seconds) according to a specific embodiment.

C. Depending upon the embodiment, the present invention may use a desired surface roughness to control the bond wave. That is, higher pressure and rough surfaces can lead to uncontrolled bonding.

D. In a preferred embodiment, the present bonding process and apparatus may be substantially free from any physical and/or mechanical flags or other elements that can be provided in a "quality area" of the bond. Here, the term "quality area" can be interpreted as the bond area, which is free from peripheral regions, according to a specific embodiment. In a specific embodiment, the present method and apparatus can be used to control a bond wave speed independent of ambient gas pressure, surface roughness, bond energy, and other parameters.

E. In a preferred embodiment, the present method and apparatus uses a flexible chuck device that can be spatially adjusted and moved to cause a bond wave between the substrates to form in a controlled manner, e.g., free from slapping. Depending upon the embodiment, the chuck and substrates can be provided with high surface energies. Additionally, the substrates can be similar or dissimilar according to a specific embodiment. Furthermore, the substrates can be maintained at a reduced pressure and/or even a vacuum environment according to a specific embodiment.

Depending upon the embodiment, one or more of these benefits may be achieved. These and other benefits will be described in more throughout the present specification and more particularly below.

One possible variation of the embodiments in accordance with the present invention is to apply an etch step to the surface prep process that would make it possible to thin the wafer prior to cleaning, rinsing and bonding.

While the above has been described primarily in terms of bonding together semiconductor substrates of single crystal silicon, other types of substrates may be bonded utilizing embodiments in accordance with the present invention. Examples of such substrates include but are not limited to substrates comprising germanium, silicon germanium, a silicon carbide, a silicon-germanium alloy, gallium arsenide, indium phosphide, gallium nitride, any Group III/V or Group II/VI materials, and others.

Moreover, although the above has been described in terms of semiconductor substrates or other like substrates, there can be other variations, modifications, and alternatives. Thus while many semiconductor substrate are substantially circular in shape, this is not required by embodiments in accordance with the present invention, and substrates having other shapes could be bonded together.

For example, the substrates can be large pieces of glass exhibiting a substantially rectangular shape e.g., 73 centimeters by 92 centimeters, as may be used in the fabrication of flat panel displays. Such displays can be commonly called "Gen X" (e.g., 1, 2, 3, 4, 5, 6, 7) according to a specific embodiment. Here, the large piece of glass can have a flexible characteristic and can be fairly thin, e.g., a few millimeters and less, according to a specific embodiment. In addition to glass, the substrates can also be quartz, plastic, multi-layered, graded, patterned, any combination of these, and the like. Additionally, the glass or substrate can be of a smaller surface region that is tiled onto a larger plate according to a specific embodiment. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming multi-layered materials, the method comprising:

providing a first substrate having a first backside surface supported on a first porous chuck, and a first surface region, the first surface region being characterized by a first end and a second end;

providing a second substrate having a second backside surface supported on a second porous chuck, and a second surface region, the second surface region being characterized by a third end and a fourth end;

initiating a physical contact of a first predetermined portion of the first end of the first surface region with a second predetermined portion of the third end of the second surface region, while maintaining utilizing the first and second porous chucks, other portions of the first surface region and the second surface region substantially free from joining the other portions of the first surface region to the second surface region;

causing a bond wave to form by an interface region within a vicinity of the first predetermined portion and the second predetermined portion;

moving, using a controlled process, the bond wave from the first end of the first surface and the third end of the second surface to the second end of the first surface and the fourth end of the second surface while maintaining a determined velocity of the bond wave to form a continuous interface to join the first surface of the first substrate with the second surface of the second surface.

2. The method of claim 1 wherein the first substrate is a silicon wafer.

3. The method of claim 1 wherein the second substrate is a silicon wafer.

4. The method of claim 1 wherein the first substrate is patterned.

5. The method of claim 1 wherein the second substrate is patterned.

6. The method of claim 1 wherein the continuous interface is substantially free from one or more voids.

7. The method of claim 1 wherein the first surface region comprises an activated region.

8. The method of claim 1 wherein the second surface region comprises an activated region.

9. The method of claim 1 wherein the first chuck is flexible and adapted to change in shape to facilitate the controlled process.

10. The method of claim 1 wherein the second chuck is flexible and adapted to change in shape to facilitate the controlled process.

11. The method of claim 1 further comprising performing a plasma activation process on either one or both of the first surface region and the second surface region before initiating the physical contact.

12. The method of claim 1 wherein the first substrate and the second substrate is maintained in a vacuum environment during the formation of the bondwave and formation of the continuous interface.

13. The method of claim 1 further comprising maintaining the first surface region and the second surface region substantially free from any mechanical flags during the movement of the bond wave from the first end of the first surface to the first end of the second surface.

14. The method of claim 1 wherein the first substrate is characterized by a diameter of about 200 mm and greater.

15. The method of claim 1 wherein the first substrate is characterized by a diameter of about 300 mm and greater.

16. The method of claim 1 wherein the second substrate is characterized by a diameter of about 200 mm and greater.

17. The method of claim 1 wherein the second substrate is characterized by a diameter of about 300 mm and greater.

18. The method of claim 1 wherein the controlled processes is provided by mechanical control.

19. The method of claim 1 wherein the controlled process is provided by chemical control.

20. The method of claim 1 wherein the controlled process is provided by thermal control.

21. The method of claim 1 wherein the controlled process is provided by a change in pressure.

22. The method of claim 1 wherein the interface region borders a bonded portion of the first surface region and the second surface region and an unbonded portion of the first surface region and the second surface region.

23. The method of claim 1 wherein the interface region is substantially continuous and free from dislocations.

24. The method of claim 1 wherein the interface region is characterized by a single front.

25. The method of claim 1 wherein the bond wave is characterized by a single front.

26. The method of claim 1 wherein the determined velocity ranges from about 10 to about 0.1 cm/seconds.

27. The method of claim 1 wherein the determined velocity is substantially constant.

28. The method of claim 1 wherein the determined velocity decreases at the second end and the fourth end.

29. The method of claim 1 wherein the first surface region comprises a compliant layer.

30. The method of claim 1 wherein the second surface region comprises a compliant layer.

31. The method of claim 1 wherein the first substrate is selected from silicon or quartz or glass.

32. The method of claim 1 wherein the first substrate is a piece of glass for a flat panel display.

33. An apparatus comprising:
a first porous and flexible chuck in pneumatic communication with a vacuum;
a second porous and flexible chuck in pneumatic communication with the vacuum;
a substrate handing apparatus configured to position a backside of a first wafer in contact with the first chuck, and to position a backside of a second wafer in contact with the second chuck; and
an energy source configured to pinch together first ends of the first and second wafers and thereby initiate a bonding wave.

34. The apparatus of claim 33 wherein the first chuck comprises a porous polymer.

35. The apparatus of claim 34 wherein the first chuck comprises porous polyethylene.

36. The apparatus of claim 34 wherein a surface of the porous polymer is sealed except for a first area configured to be in communication with the vacuum, and a second area configured to contact the backside of the substrate.

37. The apparatus of claim 33 wherein the first chuck exhibits a substantially circular shape.

38. The apparatus of claim 33 wherein the first chuck exhibits a substantially rectangular shape.

39. The apparatus of claim 33 further comprising a vacuum suction cup configured to contact a backside of a most deflected region of the first chuck.

* * * * *